US006548383B1

(12) United States Patent
Trivedi et al.

(10) Patent No.: US 6,548,383 B1
(45) Date of Patent: Apr. 15, 2003

(54) TWIN WELL METHODS OF FORMING CMOS INTEGRATED CIRCUITRY

(75) Inventors: Jigish D. Trivedi, Boise, ID (US); Zhongze Wang, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/441,912

(22) Filed: Nov. 17, 1999

(51) Int. Cl.[7] ............................................. H01L 21/425
(52) U.S. Cl. ...................................... 438/532; 438/527
(58) Field of Search .............................. 438/217, 289, 438/450, 514, 520, 527, 532

(56) References Cited

U.S. PATENT DOCUMENTS

| 5,141,882 A | * | 8/1992 | Komori et al. ............. 438/450 |
| 5,395,773 A | * | 3/1995 | Ravindhran et al. ........ 438/217 |
| 5,489,540 A | * | 2/1996 | Liu et al. ................... 438/228 |
| 5,989,949 A | * | 11/1999 | Kim et al. .................. 438/217 |
| 6,049,113 A | * | 4/2000 | Shida ......................... 257/369 |
| 6,077,735 A | * | 6/2000 | Ezaki et al. ................ 438/225 |
| 6,251,718 B1 | * | 6/2001 | Akamatsu et al. .......... 438/217 |
| 6,294,416 B1 | * | 9/2001 | Wu ............................. 438/199 |

OTHER PUBLICATIONS

Wolf, S.; Silicon Processing for the VLSI Era vol. 3: The Submicron Mosfet, Sunset Beach, CA, 1995, pp. 554–555.*

* cited by examiner

*Primary Examiner*—John F. Niebling
*Assistant Examiner*—Christopher Lattin
(74) *Attorney, Agent, or Firm*—Wells St. John P.S.

(57) ABSTRACT

In accordance with an aspect of the invention, a twin-well method of forming CMOS integrated circuitry having first and second conductivity type gates includes conducting a first conductivity type well implant, a second conductivity type well implant, a first conductivity type gate implant and a second conductivity type gate implant using no more than two masking steps. In another aspect of the invention, a twin well method of forming CMOS integrated circuitry having first and second conductivity type transistor gates includes conducting a first conductivity type well implant and a second conductivity type gate implant in a common masking step.

49 Claims, 6 Drawing Sheets

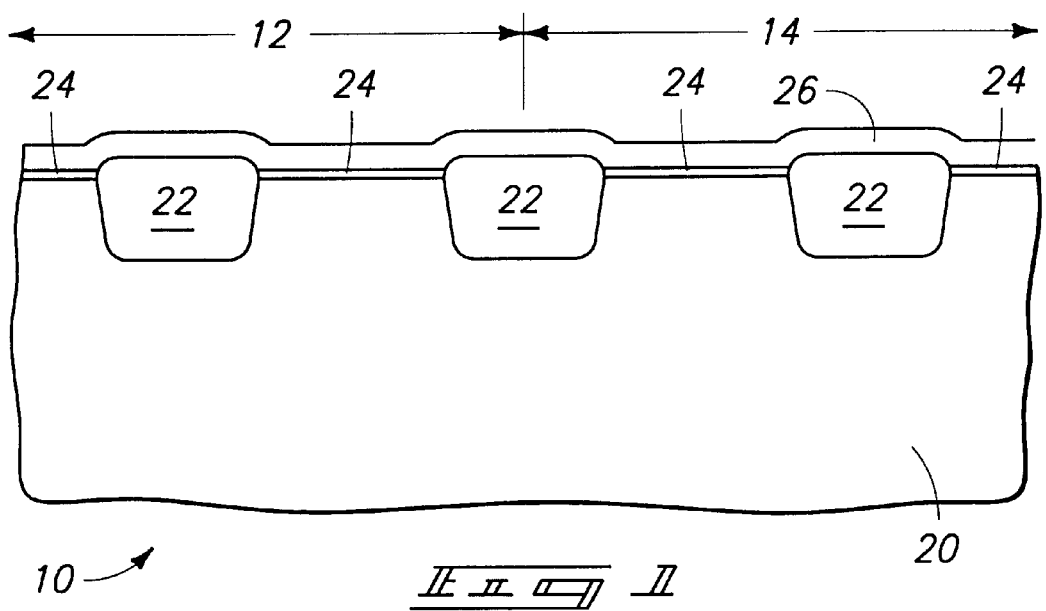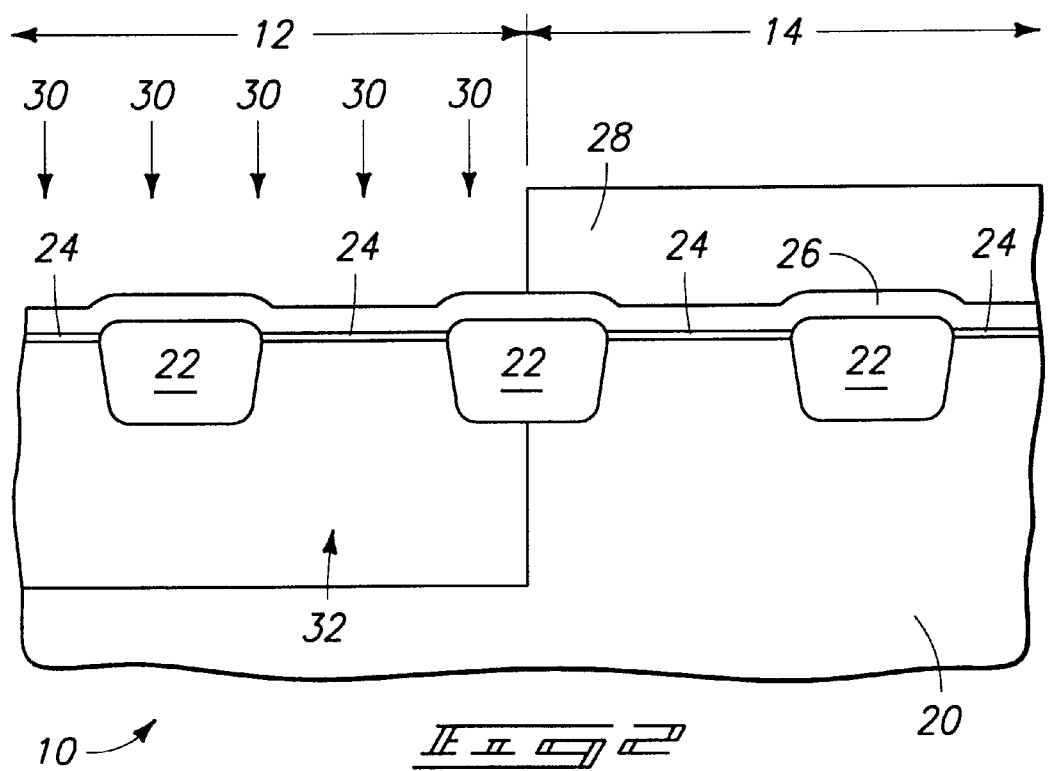

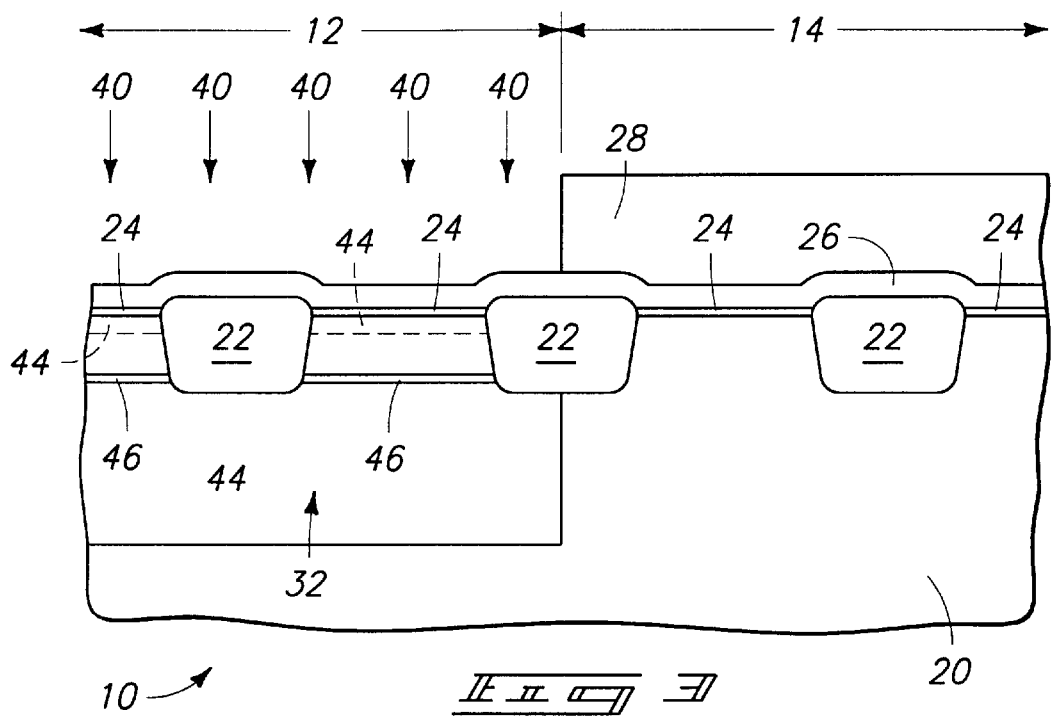
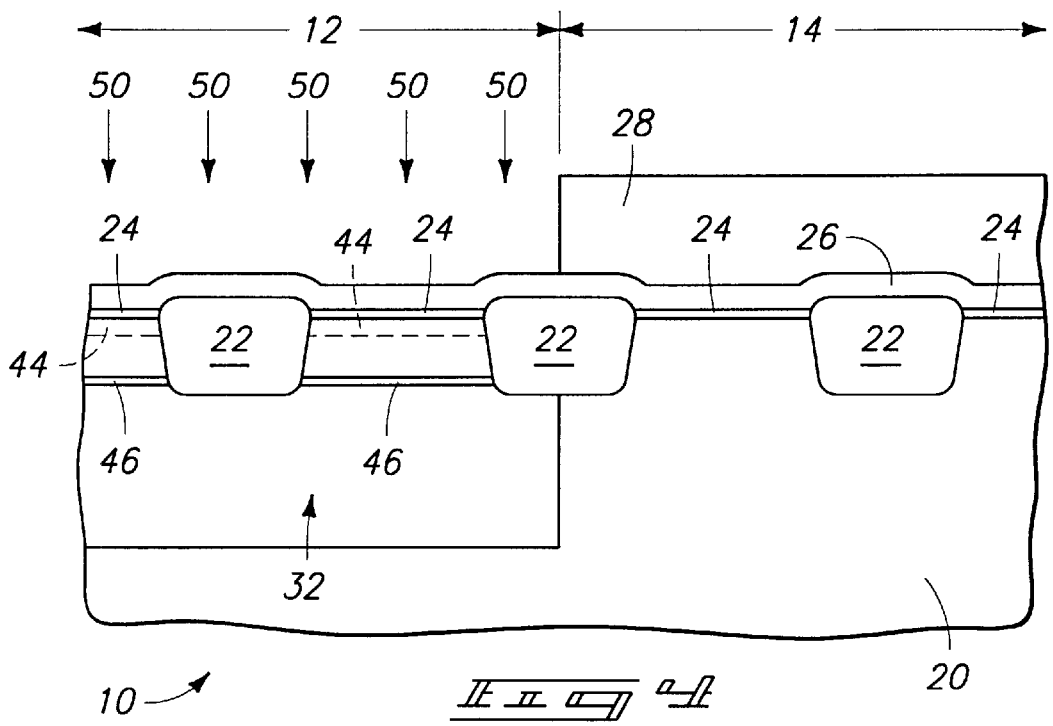

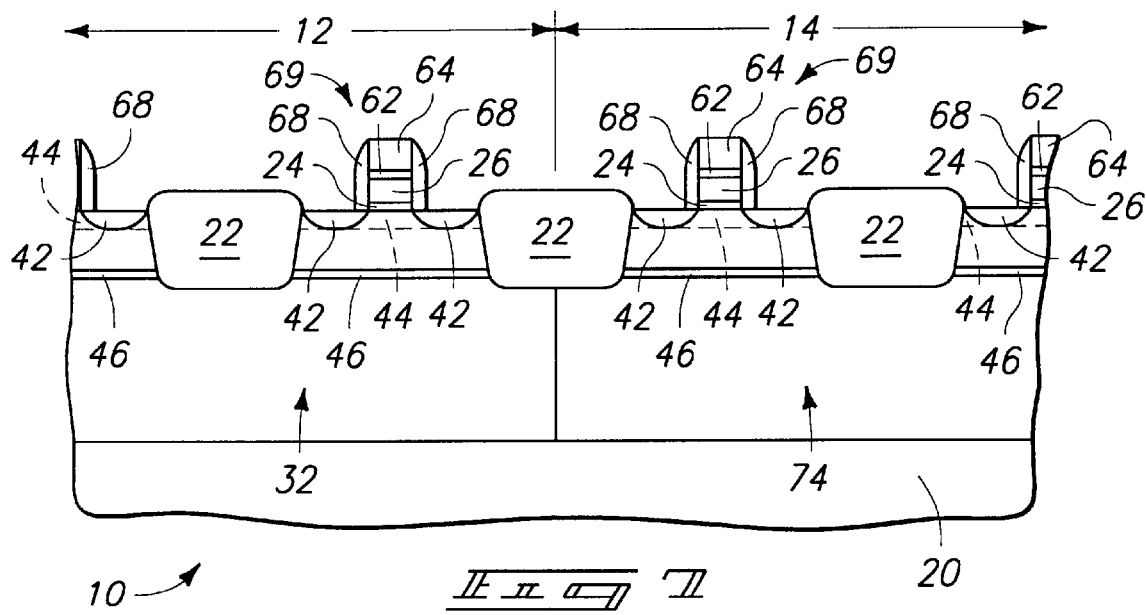
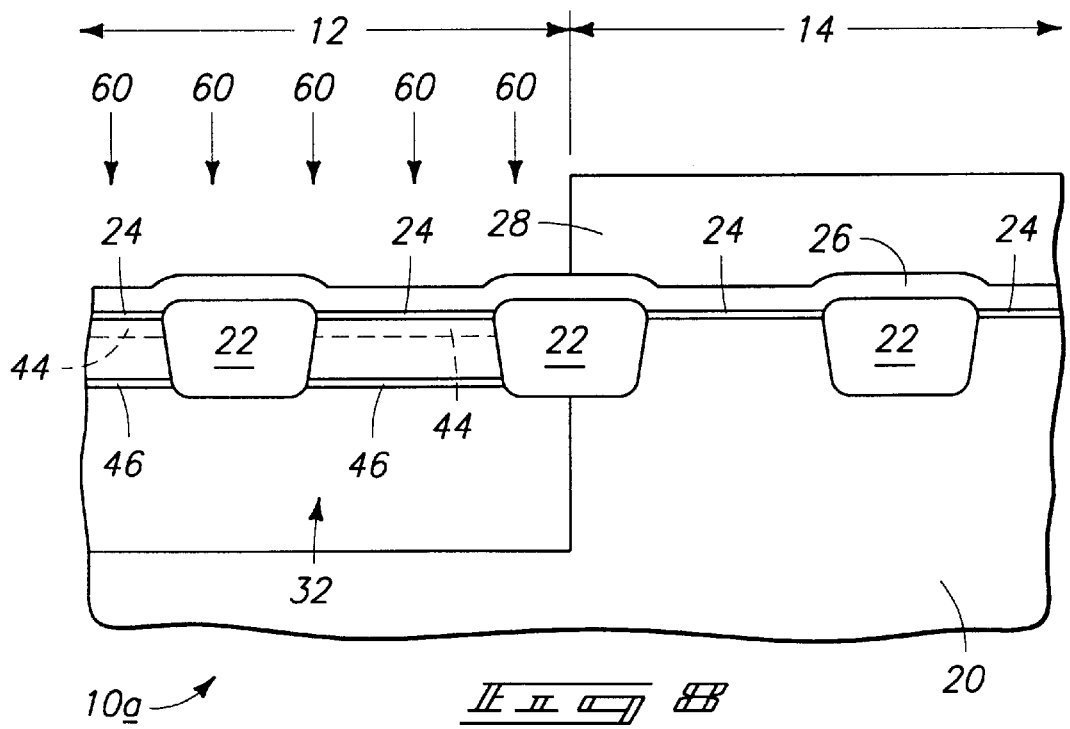

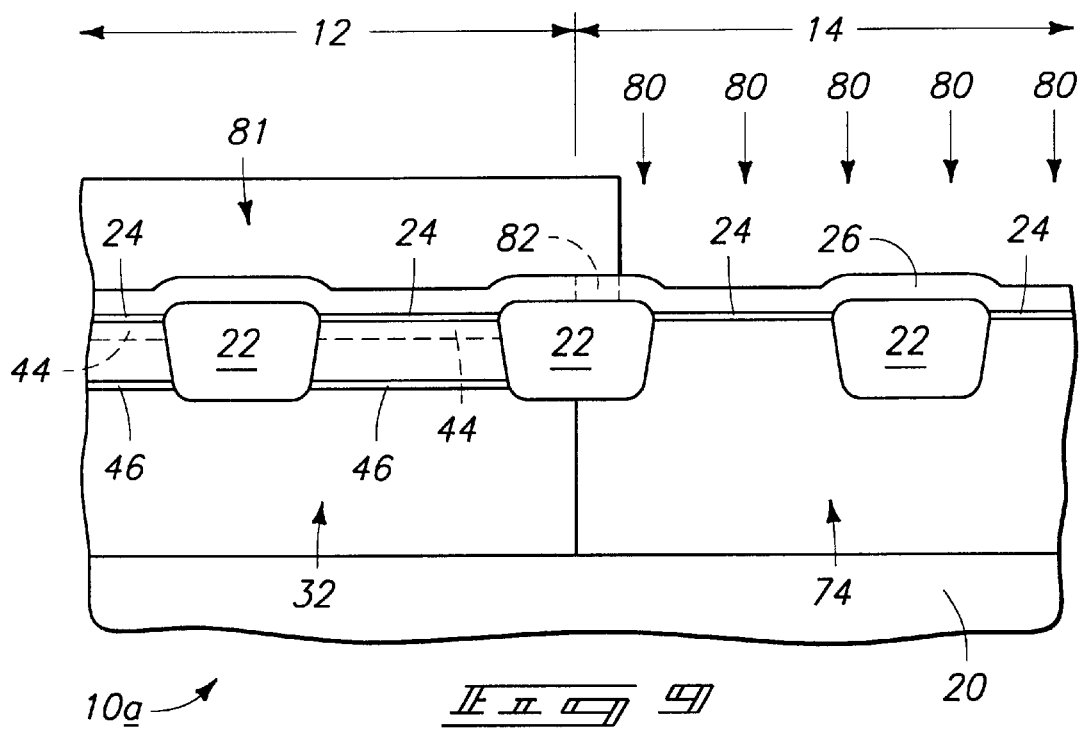
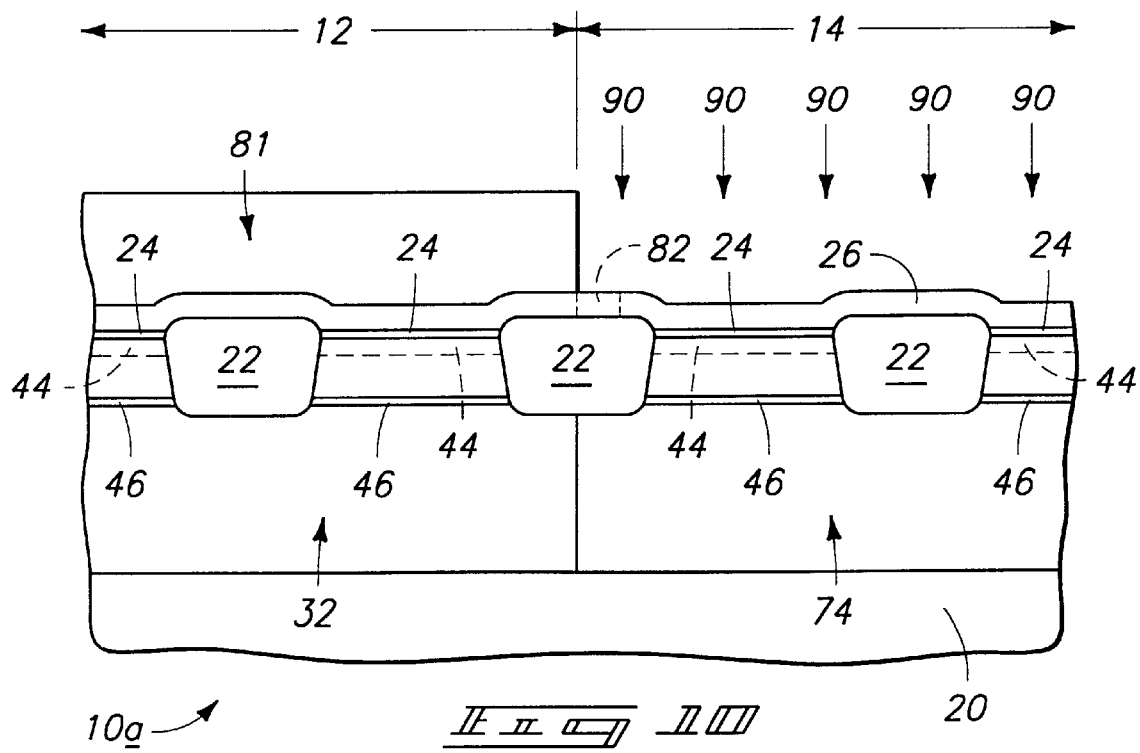

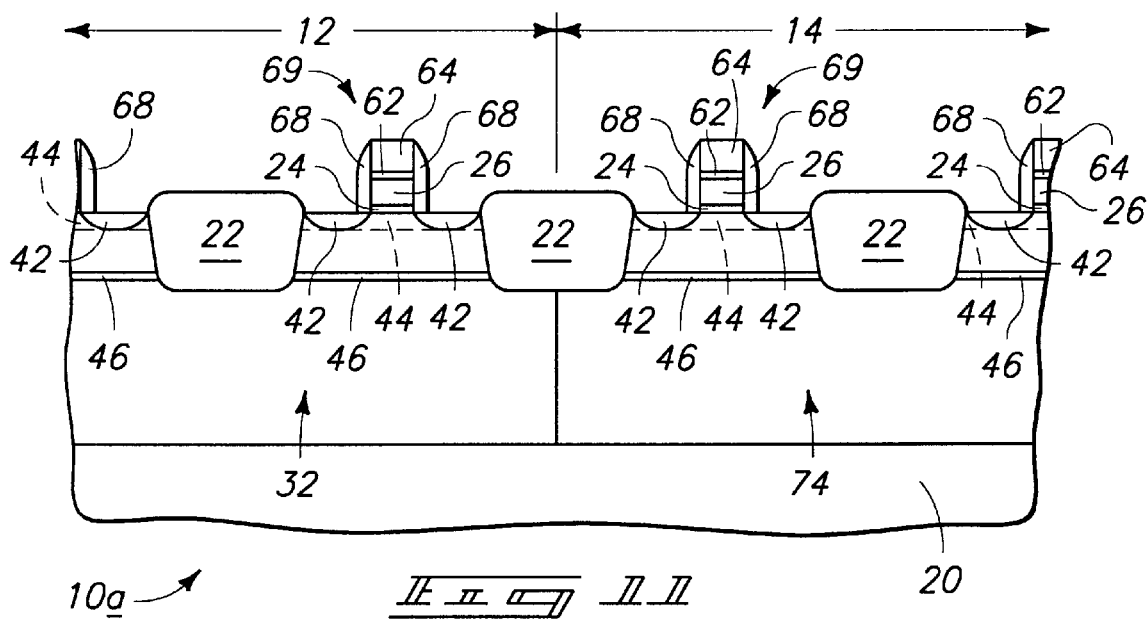

TWIN WELL METHODS OF FORMING CMOS INTEGRATED CIRCUITRY

TECHNICAL FIELD

This invention relates to twin well methods of forming CMOS integrated circuitry.

BACKGROUND OF THE INVENTION

Typical CMOS circuitry fabrication includes several major process operations, with each operation requiring several steps and sub-steps. In each sub-step, several events could result in defective CMOS transistors, for example, substrate breakage, substrate warping, process variation, process defects and masking defects. The higher the number of sub-steps or steps, the higher the potential that a semiconductor substrate will not result with operable circuitry. Accordingly, the semiconductor processing industry is continually striving to reduce the number of processing steps, including masking steps.

CMOS circuitry includes PMOS transistor devices and NMOS transistor devices formed proximate each other over a semiconductor substrate. A component of each device includes a well structure in the semiconductor substrate. The PMOS devices are formed in n-wells while NMOS devices are formed in p-wells. One conventional method for forming the wells is a "twin-well" method. A semiconductor substrate is cut from an ingot and provided by a silicon ingot supplier. Typically, the semiconductor substrate received is p− doped.

Two separate masking steps provide the p-well and n-well within the p− doped substrate. The substrate is initially masked so that one of the desired p-well or n-well regions is masked while the other is unmasked. The desired implant is then conducted into the unmasked region to form the desired well. The process is then reversed with the just implanted region masked, and the other region unmasked and subjected to the opposite type dopant implant.

The transistor gates are typically formed after the well implants previously described and includes all the gate structures to be heavily n+ doped polysilicon for both the PMOS and NMOS devices. However, high performance CMOS devices, such as SRAMs and EDRAMs, may include p-type polysilicon gates for the PMOS devices and n-type polysilicon gates for the NMOS devices. To provide these gate structure designs, two masking steps are performed. One is for the p-type implant for the PMOS devices and one is for the n-type implant for the NMOS devices. Combine these two masking steps with the two masking steps previously discussed for "twin-well" formation and at least four masking steps are performed to implant the wells and gates during CMOS transistor fabrication.

Furthermore, each masking step has inherent and unique problems, particularly alignment accuracy during application of masking material. If the masking material is not aligned properly, one conductivity material in the PMOS devices may overlap another conductivity material in the NMOS devices effectively rendering the devices useless. For example, the p-type polysilicon gate for the PMOS device and n-type polysilicon gate for the NMOS device previously discussed are in such close proximity that the masking steps poses process limitations for CMOS fabrication. As the spacing between the PMOS and NMOS devices diminishes, alignment tolerances decrease thereby increasing the difficulty of aligning the masking material.

SUMMARY OF THE INVENTION

In accordance with an aspect of the invention, a twin-well method of forming CMOS integrated circuitry having first and second conductivity type gates includes conducting a first conductivity type well implant, a second conductivity type well implant, a first conductivity type gate implant and a second conductivity type gate implant using no more than two masking steps.

In another aspect of the invention, a twin well method of forming CMOS integrated circuitry having first and second conductivity type transistor gates includes conducting a first conductivity type well implant and a second conductivity type gate implant in a common masking step.

In yet another aspect of the invention, a twin well method of forming CMOS integrated circuitry having first and second conductivity type transistor gates includes depositing a transistor gate layer of a semiconductive material over a semiconductor substrate. After depositing the transistor gate layer and in one masking step, effectively masking a first substrate area configured for formation of first conductivity type transistors while leaving a second substrate area configured for formation of second conductivity type transistors effectively unmasked. In the one masking step, a first conductivity type well implant is conducted into the second substrate area and a second conductivity type gate implant is conducted into the transistor gate layer within the second substrate area. In another masking step after the one masking step, the second substrate area is effectively masked by a masking material and only a portion of the first substrate area is effectively masked while leaving a majority of the first substrate area effectively unmasked. With the masking material in place, a first conductivity type implant is conducted into the transistor gate layer within the first substrate area while leaving a substantially undoped region of transistor gate layer semiconductive material within the first substrate area. After conducting the first conductivity type implant into the transistor gate layer within the first substrate area, at least some of the masking material within the first substrate area is laterally etched away. After laterally etching away the masking material within the first substrate area, a second conductivity type well implant is conducted within the first substrate area.

BRIEF DESCRIPTION OF THE DRAWINGS

Preferred embodiments of the invention are described below with reference to the following accompanying drawings.

FIG. 1 is a fragmentary sectional view of a semiconductor substrate at one processing step in accordance with one embodiment of the invention.

FIG. 2 is a view of the FIG. 1 substrate fragment at a processing step subsequent to that shown in FIG. 1.

FIG. 3 is a view of the FIG. 1 substrate fragment at a processing step subsequent to that shown in FIG. 2.

FIG. 4 is a view of the FIG. 1 substrate fragment at a processing step subsequent to that shown in FIG. 3.

FIG. 7 is a view of the FIG. 1 substrate fragment at a processing step subsequent to that shown in FIG. 6.

FIG. 8 is a fragmentary sectional view of a semiconductor substrate at one processing step in accordance with another embodiment of the invention.

FIG. 9 is a view of the FIG. 8 substrate fragment at a processing step subsequent to that shown in FIG. 8.

FIG. 10 is a view of the FIG. 8 substrate fragment at a processing step subsequent to that shown in FIG. 9.

FIG. 11 is a view of the FIG. 8 substrate fragment at a processing step subsequent to that shown in FIG. 10.

DETAILED DESCRIPTION OF THE PREFERRED EMBODIMENTS

Figure 5:
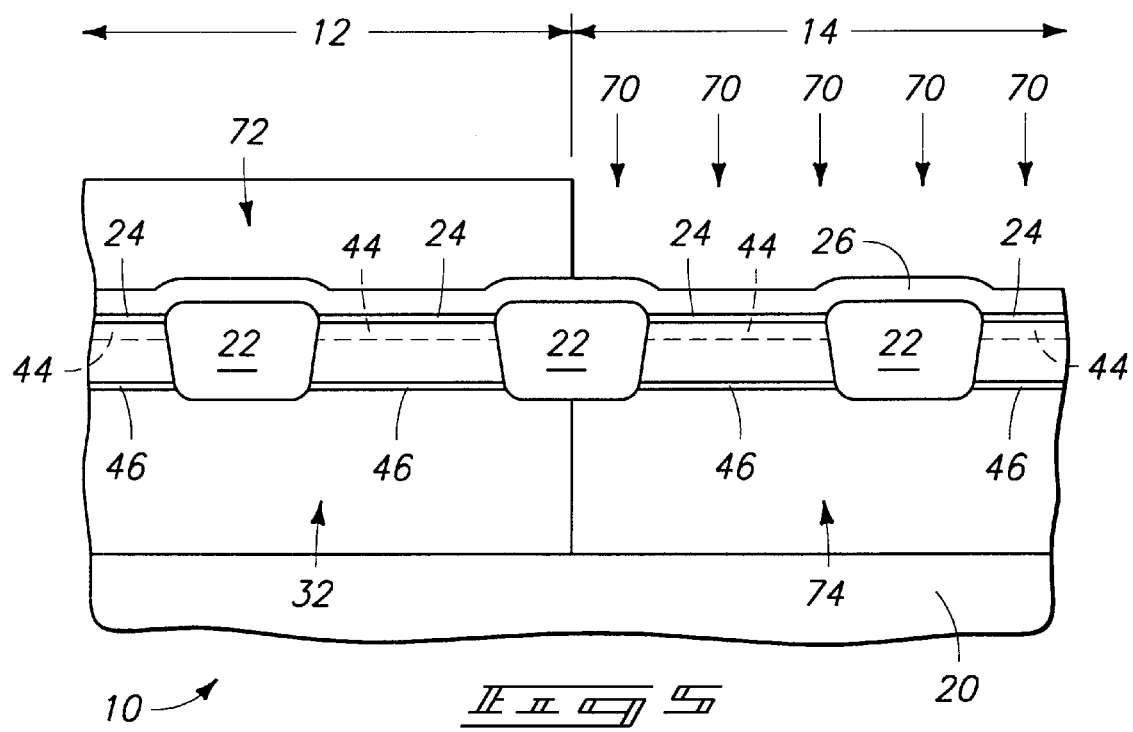
FIG. 5 is a view of the FIG. 1 substrate fragment at a processing step subsequent to that shown in FIG. 4.

This disclosure of the invention is submitted in furtherance of the constitutional purposes of the U.S. Patent Laws "to promote the progress of science and useful arts" (Article 1, Section 8).

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

With reference to FIGS. 1–7, an embodiment of the method of the present invention is illustrated. This embodiment encompasses a twin-well method of forming CMOS integrated circuitry having first and second conductivity type transistor gates (i.e., p and n type, or n and p type). Referring to FIG. 1, a semiconductor substrate in process is indicated generally by reference numeral 10. A first substrate area 14 is configured for formation of first conductivity type transistors and a second substrate area 12 is configured for formation of second conductivity type transistors. The semiconductor fragment 10 comprises bulk substrate material 20, for example, monocrystalline silicon. The semiconductor substrate 10 comprises isolation regions 22 formed therein and a gate dielectric layer 24 formed thereon. An exemplary dielectric layer 24 comprises silicon dioxide. A transistor gate layer 26 comprising a semiconductor material is formed over the semiconductor substrate 10. An exemplary semiconductor material comprises polysilicon.

Referring to FIG. 2, after forming the transistor gate layer, a first masking material 28 (i.e., photoresist) masks the first substrate area 14 while leaving the second substrate area 12 unmasked. In one masking step, a first conductivity type well implant 30 is conducted into the second substrate area 12 to form first conductivity type well 32. Referring to FIG. 3, in the one masking step, exemplary implants 40 may be conducted, for example, punch-through implants 46 and channel enhancement implants 44.

Referring to FIG. 4, in the one masking step, a second conductivity type gate implant 50 is conducted into the transistor gate layer 26 within the second substrate area 14.

Referring to FIG. 5, the first masking material 28 is removed from the first substrate area 14 and the second substrate area 12 is masked with another masking material 72 (i.e., photoresist). In the shown embodiment, various implants are indicated generally by reference numeral 70. While the second substrate area 12 is masked with masking material 72, a first conductivity type gate implant is conducted into the transistor gate layer 26 within the first substrate area 14 and a second conductivity type well implant into the first substrate area 14 to form second conductivity type well 74. While the second substrate area 12 is masked, other exemplary implants may be conducted, for example, punch-through implants 46 and channel enhancement implants 44.

Figure 6:
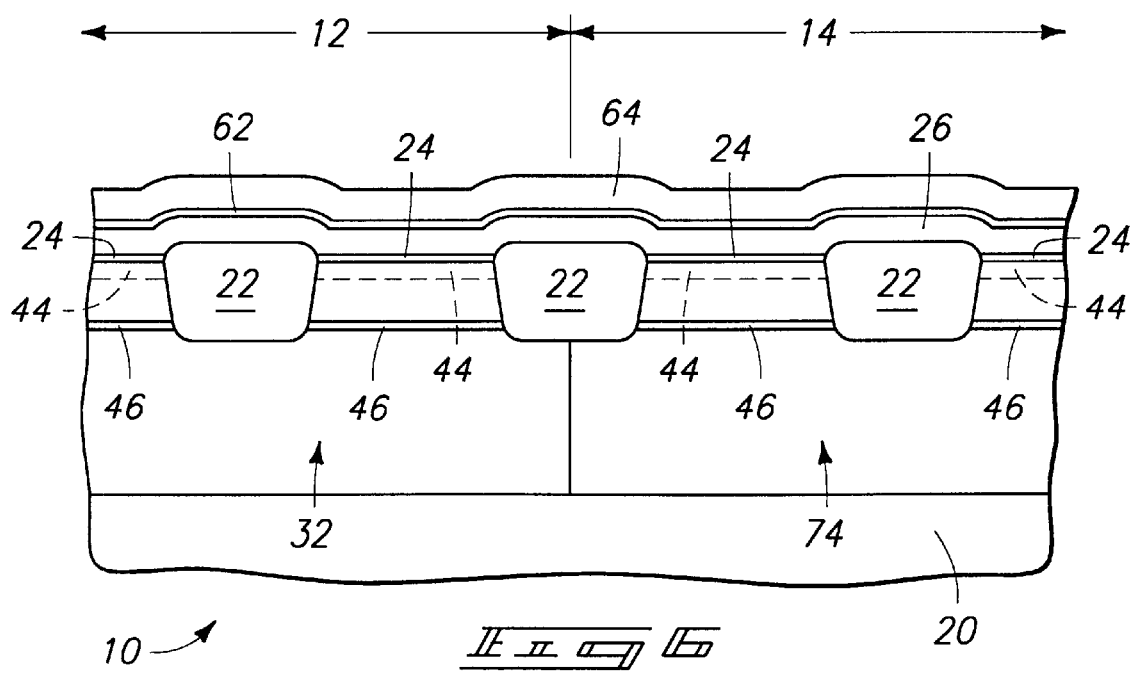
FIG. 6 is a view of the FIG. 1 substrate fragment at a processing step subsequent to that shown in FIG. 5.

Referring to FIG. 6, the second masking material 72 is removed from the second substrate area 12. A layer 62 comprising one or any combination of elemental metals, metal alloys, metal silicides, and metal nitrides is formed over transistor gate layer 26. An insulative layer 64 is formed over layer 62. An exemplary insulative layer 64 comprises silicon dioxide deposited by a TEOS source, or alternatively $Si_3N_4$.

Referring to FIG. 7, transistor gates 69 are formed over the first and second substrate areas 14/12 from the transistor gate layer 26, layer 62 and insulative layer 64. Insulative spacers 68 can be formed adjacent transistor gates 69. Source/drain regions 42 are formed proximate the transistor gates 69 in the first and second substrate areas 14/12. In accordance with one aspect of the invention, in any one common masking step, the well implants, gate implants, channel enhancement implants and punch-through implants disclosed in FIGS. 1–7 can be conducted in any order and in any combination, as might be selected or optimized by the designer.

With reference to FIGS. 8–11, a second embodiment of the method of the present invention is illustrated. Like numerals from the first described embodiment are employed where appropriate, with differences being indicated with the suffix (a) or with different numerals.

Referring to FIG. 8, in one masking step, the first substrate area 14 is masked by first masking material 28 while leaving the second substrate area 12 effectively unmasked. In the one masking step, implants 60 include a first conductivity type well implant conducted into the second substrate area 12 to form first conductivity type well 32 and a second conductivity type gate implant conducted into the transistor gate layer 26 within the second substrate area 12. Additional exemplary implants may be conducted, such as, punch-through implants 46 and channel enhancement implants 44. In accordance with an aspect of the invention, in this one common masking step, the well implants, gate implants, channel enhancement implants and punch-through implants can be conducted in any order and in any combination.

Referring to FIG. 9, the first masking material 28 is removed from the first substrate area 14 and in another masking step after the one masking step, the second substrate area 12 and only a portion of the first substrate area 14 proximate the second substrate area 12 are masked with a second masking material 81 while leaving a majority of the first substrate area 14 effectively unmasked. With the second masking material 81 in place, a first conductivity type gate implant 80 is conducted into the transistor gate layer 26 within the first substrate area 14 leaving a substantially undoped region 82 of transistor gate layer semiconductor material within the first substrate area 12 proximate the second conductivity type gate implant into the transistor gate layer 26. In the context of this document, "substantially undoped region" defines a region having $10^{16}$ atoms/$cm^3$ of dopant concentration.

Referring to FIG. 10, after the first conductivity type gate implant 80 is conducted into. the transistor gate layer 26 within the first substrate 14, at least some of the second masking material 81 is laterally etched away to remove it from being received within the first substrate area 14 while leaving the second substrate area 12 effectively covered. An exemplary laterally etching comprises an isotropic etching, for example, a photoresist descum etching. Exemplary descum etching processes comprise exposing semiconductor substrate 10 to any one of the three following environments. A first environment includes a temperature at about 90° C., 1.5 Torr, for approximately one minute, in $O_2$ at 2100 sccm. A second environment includes a temperature at about 90° C., 1.5 Torr, for a time range of 10 seconds to 10 minutes, in O₂ at a range of 200 to 2100 sccm. The slower the O₂ flow the slower the etch rate of the masking material. Accordingly, one can selectively control the etching process of second masking material 81 to any desired dimensions. A third environment includes a temperature at about 90° C., 1.5 Torr, for approximately 125 minutes, in O₂ at 2100 sccm and 2000 W microwave power. A second exemplary isotropic etching comprises an in situ process in an etch chamber exposing semiconductor substrate 10 to a CF₄ and/or CHF₃ based plasma at a power of approximately 200 W for a time range of from 2 to 25 seconds.

After the isotropic etching, a second conductivity type well implant 90 is conducted within the first substrate area 14. Additional exemplary implants may be conducted, for example, punch-through implants 46 and channel enhancement implants 44.

Referring to FIG. 11, the second masking material 81 is removed from the second substrate area 12 and transistor gates 69 are formed over the first and second substrate areas 14/12 from the transistor gate layer 26. After forming the transistor gates 69, source/drain regions 42 are formed proximate the transistor gates 69 in the first and second substrate areas 14/12.

A preferred goal in the second embodiment is independent control of the spacing between the gate implants and the well implants. By controlling the amount of second masking material 81 formed over the first substrate area 14 proximate the second substrate area 12, the dimensions of undoped region 82 can be controlled. Accordingly, the spacing between the first conductivity type gate implant and the second conductivity type gate implant can be controlled. Additionally, by selectively controlling the etching process of second masking material 81, the dimensions of the subsequent well implant can be controlled. Accordingly, the spacing between the first conductivity type well implant and the second conductivity type well implant can be controlled. Independently controlling the spacing between well implants and between gate implants eases the tolerance parameters of any given masking step. Consequently, the fabrication of CMOS devices with smaller dimensions is possible because masking process constraints are diminished with the increased tolerances.

Further in accordance with an aspect of the invention, all the implants are collectively conducted using two masking steps. An exemplary masking material for any one, or all, the masking steps comprises photoresist. Still further in accordance with the invention, the first conductivity type comprises n and the second conductivity type comprises p. Alternatively, the first conductivity type comprises p and the second conductivity type comprises n. Moreover, as shown in the embodiments, the first substrate area 14 can be masked first; however, the second substrate area 12 can be masked first.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A twin-well method of forming CMOS integrated circuitry having first and second conductivity type transistor gates comprising conducting a first conductivity type well implant, a second conductivity type well implant, a first conductivity type gate implant and a second conductivity type gate implant, and wherein all said implants are collectively conducted using only two masking steps, each masking step comprising conducting a well implant of one of the first and second conductivity types and conducting a gate implant of the other of the first and second conductivity types.

2. The twin-well method of claim 1 wherein all said implants are collectively conducted using two masking steps, at least one of the two masking steps comprising conducting the well implant after conducting the gate implant.

3. The twin-well method of claim 1 further comprising:
   providing a semiconductor substrate;
   depositing a transistor gate layer over the semiconductor substrate and into which the gate implants are made; and
   after depositing the transistor gate layer, conducting at least one of the well implants into the semiconductor substrate.

4. The twin-well method of claim 3 wherein the transistor gate layer comprises polysilicon.

5. The twin-well method of claim 1 wherein at least one masking step comprises conducting a channel enhancement implant, a well implant and a gate implant.

6. The twin-well method of claim 1 wherein at least one masking step comprises conducting a punch-through implant.

7. A twin-well method of forming CMOS integrated circuitry having first and second conductivity type transistor gates comprising conducting a first conductivity type well implant, a second conductivity type gate implant, and a channel enhancement implant in a common masking step.

8. The twin-well method of claim 7 wherein the first conductivity type is p and the second conductivity type is n.

9. The twin-well method of claim 7 wherein the first conductivity type is n and the second conductivity type is p.

10. The twin-well method of claim 7 wherein within the common masking step conducting a punch-through implant.

11. The twin-well method of claim 7 wherein the common masking step comprises photomasking.

12. The twin-well method of claim 7 further comprising in another common masking step, conducting a second conductivity type well implant, a first conductivity type gate implant, and a channel enhancement implant.

13. A twin-well method of forming CMOS integrated circuitry having first and second conductivity type transistor gates comprising conducting a first conductivity type well implant and a second conductivity type gate implant in a common masking step.

14. The twin-well method of claim 13 further comprising:
   providing a semiconductor substrate;
   depositing a transistor gate layer over the semiconductor substrate and into which the gate implants are made; and
   after depositing the transistor gate layer, conducting the common masking step.

15. The twin-well method of claim 14 wherein after depositing the transistor gate layer and in another common masking step, conducting a second conductivity type well implant and a first conductivity type gate implant.

16. A twin-well method of forming CMOS integrated circuitry having first and second conductivity type transistor gates comprising:

depositing a transistor gate layer of a semiconductor material over a semiconductor substrate;

after depositing the transistor gate layer and in one masking step, effectively masking a first substrate area configured for formation of first conductivity type transistors while leaving a second substrate area configured for formation of second conductivity type transistors effectively unmasked;

conducting a first conductivity type well implant into the second substrate area and a second conductivity type gate implant into the transistor gate layer within the second substrate area in the one masking step;

in another masking step after the one masking step, effectively masking the second substrate area and only a portion of the first substrate area with a masking material while leaving a majority of the first substrate area effectively unmasked;

with the masking material in place, conducting a first conductivity type implant into the transistor gate layer within the first substrate area and leaving a substantially undoped region of transistor gate layer semiconductor material within the first substrate area;

after conducting the first conductivity type implant into the transistor gate layer within the first substrate area, laterally etching away at least some of the masking material within the first substrate area; and after laterally etching away the masking material within the first substrate area, conducting a second conductivity type well implant within the first substrate area.

17. The twin-well method of claim 16 wherein conducting the first conductivity type well implant into the second substrate area is performed before conducting the second conductivity type gate implant into the transistor gate layer within the second substrate area.

18. The twin-well method of claim 16 wherein conducting the first conductivity type well implant into the second substrate area is performed after conducting the second conductivity type gate implant into the transistor gate layer within the second substrate area.

19. The twin-well method of claim 16 wherein masking the first substrate area further comprises conducting a channel enhancement implant and a punch-through implant.

20. The twin-well method of claim 16 wherein masking the second substrate area further comprises conducting a channel enhancement implant and a punch-through implant.

21. The twin-well method of claim 16 wherein the first conductivity type transistors comprise a p-type conductivity material and the second conductivity type transistors comprise a n-type conductivity material.

22. The twin-well method of claim 16 wherein the first conductivity type transistors comprise a n-type conductivity material and the second conductivity type transistors comprise a p-type conductivity material.

23. The twin-well method of claim 16 wherein the laterally etching comprises isotropic etching the masking material.

24. The twin-well method of claim 16 wherein at least one of the masking steps further comprises conducting a punch-through implant and a channel enhancement implant in the respective substrate areas.

25. A twin-well method of forming CMOS integrated circuitry having first and second conductivity type transistor gates comprising:

depositing a transistor gate layer of a semiconductor material over a semiconductor substrate;

forming a first conductivity type well region and second conductivity type doped semiconductor material of the gate layer within a second substrate area configured for formation of second conductivity type transistors;

effectively masking the second substrate area and only a portion of a first substrate area configured for formation of first conductivity type transistors with a masking material while leaving a majority of the first substrate area effectively unmasked;

with the masking material in place, conducting a first conductivity type implant into the transistor gate layer within the first substrate area and leaving a substantially undoped region of transistor gate layer semiconductor material within the first substrate area;

after conducting the first conductivity type implant into the transistor gate layer within the first substrate area, laterally etching away at least some of the masking material within the first substrate area; and after laterally etching away the masking material within the first substrate area, conducting a second conductivity type well implant within the first substrate area.

26. The twin-well method of claim 25 wherein the portion of first substrate area is immediately adjacent the second substrate area.

27. The twin-well method of claim 25 wherein the laterally etches all masking material away from within the first substrate area.

28. The twin-well method of claim 25 wherein the masking comprises photomasking.

29. The twin-well method of claim 25 wherein the laterally etching comprises isotropic etching the masking material.

30. The twin-well method of claim 25 wherein the first conductivity type transistors comprise a p-type conductivity material and the second conductivity type transistors comprise a n-type conductivity material.

31. The twin-well method of claim 25 wherein the first conductivity type transistors comprise a n-type conductivity material and the second conductivity type transistors comprise a p-type conductivity material.

32. A method of forming CMOS integrated circuitry having first and second conductivity type transistor gates comprising:

depositing a transistor gate layer of a semiconductor material over a semiconductor substrate;

doping the transistor gate layer semiconductor material with a second conductivity type impurity within a second substrate area configured for formation of second conductivity type transistors;

effectively masking the second substrate area and only a portion of a first substrate area configured for formation of first conductivity type transistors with a masking material while leaving a majority of the first substrate area effectively unmasked; and with the masking material in place, conducting a first conductivity type implant into the transistor gate layer within the first substrate area and leaving a substantially undoped region of transistor gate layer semiconductor material within the first substrate area; and after conducting the first conductivity type implant into the transistor gate layer within the first substrate area, removing the masking material from the substrate and leaving substantially undoped semiconductor material of the transistor gate layer intermediate a first conductivity type doped region and a second conductivity type doped region of the transistor gate layer.

33. A twin-well method of forming CMOS integrated circuitry having first and second conductivity type transistor gates comprising:

providing a semiconductor substrate having isolation regions formed therein;

forming a transistor gate dielectric layer over the semiconductor substrate;

depositing a transistor gate layer of a semiconductor material over the transistor gate dielectric layer;

after depositing the transistor gate layer and in one masking step, masking a first substrate area for formation of first conductivity type transistors with a first masking material while leaving a second substrate area for formation of second conductivity type transistors unmasked;

conducting a first conductivity type well implant into the second substrate area and a second conductivity type gate implant into the transistor gate layer within the second substrate area in the one masking step;

removing the first masking material from the first substrate area and masking the second substrate area with another masking material;

while the second substrate area is masked with a second masking material, conducting a first conductivity type gate implant into the transistor gate layer within the first substrate area and a second conductivity type well implant into the first substrate area;

removing the second masking material from the second substrate area and forming transistor gates over the first and second substrate areas from the transistor gate layer; and forming source/drain regions proximate the transistor gates in the first and second substrate areas.

34. The twin-well method of claim 33 wherein the first and second masking materials comprise the same material.

35. A twin-well method of forming CMOS integrated circuitry having first and second conductivity type transistor gates comprising:

providing a semiconductor substrate having isolation regions formed therein;

forming a transistor gate dielectric layer over the semiconductor substrate;

depositing a transistor gate layer of a semiconductor material over the transistor gate dielectric layer;

after depositing the transistor gate layer and in one masking step, masking a first substrate area for formation of first conductivity type transistors with a first masking material while leaving a second substrate area for formation of second conductivity type transistors effectively unmasked;

conducting a first conductivity type well implant into the second substrate area and a second conductivity type gate implant into the transistor gate layer within the second substrate area in the one masking step;

removing the first masking material from the first substrate area and in another masking step after the one masking step, masking the second substrate area and only a portion of the first substrate area proximate the second substrate area with a second masking material while leaving a majority of the first substrate area effectively unmasked;

with the second masking material in place, conducting a first conductivity type gate implant into the transistor gate layer within the first substrate area and leaving a substantially undoped region of transistor gate layer semiconductor material within the first substrate area proximate the second conductivity type gate implant into the transistor gate layer;

after conducting the first conductivity type gate implant into the transistor gate layer within the first substrate area, isotropic etching away at least some of the second masking material to remove it from being received within the first substrate area while leaving the second substrate area effectively covered;

after the isotropic etching, conducting a second conductivity type well implant within the first substrate area;

removing the second masking material from within the second substrate area and forming transistor gates over the first and second substrate areas from the transistor gate layer; and forming source/drain regions proximate the transistor gates in the first and second substrate areas.

36. The twin-well method of claim 35 wherein the first conductivity type well implant is conducted after the second conductivity type gate implant.

37. The twin-well method of claim 35 wherein the first conductivity type transistors comprise a n-type conductivity material.

38. The twin-well method of claim 35 wherein the first conductivity type transistors comprise a p-type conductivity material.

39. A twin-well method of forming CMOS integrated circuitry having first and second conductivity type transistor gates comprising:

providing a semiconductor substrate having first and second regions;

depositing a transistor gate layer over the semiconductor substrate;

conducting a first conductivity type well implant and a second conductivity type gate implant in a first common masking step, wherein the first region is effectively masked;

conducting a second conductivity type well implant and a first conductivity type gate implant in a second common masking step, wherein the second region is effectively masked; and after the first and second common masking steps, forming first and second conductivity type transistor gates comprising at least a portion of the transistor gate layer.

40. The twin-well method of claim 39 wherein the transistor gate layer comprises polysilicon, and wherein the first conductivity type gate implant is conducted into the transistor gate layer over the second region, and wherein the second conductivity the gate implant is conducted into the transistor gate layer over the first region.

41. The twin-well method of claim 1 further comprising:

providing a semiconductor substrate;

depositing a transistor gate layer over the semiconductor substrate and into which the gate implants are made; and conducting the gate implants into the transistor gate layer and thereafter forming the transistor gate layer into transistor gates.

42. The twin-well method of claim 7 further comprising:

providing a semiconductor substrate;

depositing a transistor gate layer over the semiconductor substrate and into which the second conductivity type gate implant is made; and conducting the second conductivity type gate implant into the transistor gate layer and thereafter forming the transistor gate layer into transistor gates.

43. The twin-well method of claim 13 further comprising:

providing a semiconductor substrate;

depositing a transistor gate layer over the semiconductor substrate and into which the second conductivity type gate implant is made; and conducting the second conductivity type gate implant into the transistor gate layer and thereafter forming the transistor gate layer into transistor gates.

44. The twin-well method of claim 33 wherein the forming of the transistor gates over the first and second substrate areas from the transistor gate layer occurs after the removing of the second masking material from the second substrate area.

45. The twin-well method of claim 35 wherein the forming of the transistor gates over the first and second substrate areas from the transistor gate layer occurs after the removing of the second masking material from the second substrate area.

46. The twin-well method of claim 1 comprising forming first and second type source/drain implants after using said only two masking steps.

47. The twin-well method of claim 33 wherein the source/drain regions are formed after removing the first and second masking materials.

48. The twin-well method of claim 35 wherein the source/drain regions are formed after removing the first and second masking materials.

49. The twin-well method of claim 39 comprising forming the first and second type source/drain implants after the first and second masking steps.

\* \* \* \* \*

UNITED STATES PATENT AND TRADEMARK OFFICE
CERTIFICATE OF CORRECTION

PATENT NO. : 6,548,383 B1
DATED : April 15, 2003
INVENTOR(S) : Jigish D. Trivedi It is certified that error appears in the above-identified patent and that said Letters Patent is hereby corrected as shown below:

Column 4,
Line 53, please replace "undoped region" defines a region having $10^{16}$" with
-- undoped region" defines a region having maximun $10^{16}$ --
Line 55, please replace "implant 80 is conducted into. the transistor" with
-- implant 80 is conducted into the transistor --

Signed and Sealed this

Second Day of September, 2003

JAMES E. ROGAN
*Director of the United States Patent and Trademark Office*